US009297700B2

(12) United States Patent
Lambkin et al.

(10) Patent No.: US 9,297,700 B2
(45) Date of Patent: Mar. 29, 2016

(54) PHOTONIC SENSOR AND A METHOD OF MANUFACTURING SUCH A SENSOR

(71) Applicant: ANALOG DEVICES, INC., Norwood, MA (US)

(72) Inventors: Paul Martin Lambkin, Carrigaline (IE); William Allan Lane, Waterfall (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/692,748

(22) Filed: Dec. 3, 2012

(65) Prior Publication Data

US 2014/0151557 A1   Jun. 5, 2014

(51) Int. Cl.
| | |
|---|---|
| *G01J 5/00* | (2006.01) |
| *G01J 5/04* | (2006.01) |
| *G01J 5/02* | (2006.01) |
| *G01J 5/12* | (2006.01) |
| *G01J 5/08* | (2006.01) |
| *G01K 7/02* | (2006.01) |
| *H01L 31/18* | (2006.01) |

(52) U.S. Cl.
CPC ............. *G01J 5/04* (2013.01); *G01J 5/0225* (2013.01); *G01J 5/0831* (2013.01); *G01J 5/0853* (2013.01); *G01J 5/12* (2013.01); *G01K 7/02* (2013.01); *H01L 31/18* (2013.01)

(58) Field of Classification Search
CPC ............... G01J 5/20; G01J 5/046; G01J 5/04; G01J 5/02; G01J 5/0215; G01J 5/0235; G01J 5/024; G01J 5/08; G01J 5/0809; G01J 5/0815; G01J 5/0837; G01J 2005/0077; G01J 2005/202; G01J 3/26; G01J 3/36

USPC ........................................................ 250/338.1
See application file for complete search history.

(56) References Cited

U.S. PATENT DOCUMENTS

| | | | | |
|---|---|---|---|---|
| 5,929,441 | A * | 7/1999 | Beratan ................... | G01J 5/023 250/332 |
| 6,111,254 | A * | 8/2000 | Eden ......................... | G01J 5/08 250/332 |
| 6,448,575 | B1 * | 9/2002 | Slocum .................... | H01L 23/34 257/48 |
| 6,489,614 | B1 * | 12/2002 | Deguchi .................... | G01J 5/20 250/332 |
| 6,621,083 | B2 * | 9/2003 | Cole .......................... | G01J 5/20 250/338.1 |
| 6,777,681 | B1 * | 8/2004 | Schimert .................. | G01J 5/20 250/330 |

(Continued)

FOREIGN PATENT DOCUMENTS

| | | |
|---|---|---|
| CN | 1898538 | 1/2007 |
| CN | 101545809 | 9/2009 |

(Continued)

OTHER PUBLICATIONS

Author:Joo-Yun Jung, Title: Methods to Achieve Wavelength Selectivity in Infrared Microbolometers and Reduced Thermal Mass Microbolometers, Date: Dec. 2010, Publisher: The University of Texas at Austin.*

(Continued)

*Primary Examiner* — David J Makiya
*Assistant Examiner* — Taeho Jo
(74) *Attorney, Agent, or Firm* — Knobbe, Martens, Olson & Bear, LLP

(57) ABSTRACT

A photonic sensor, comprising: a platform, a temperature sensor on the platform; and a structure formed on or as part of the platform.

25 Claims, 9 Drawing Sheets

(56) References Cited

U.S. PATENT DOCUMENTS

| | | | |
|---|---|---|---|
| 8,047,710 B2* | 11/2011 | Ikushima | G01J 5/02 250/338.1 |
| 2003/0020017 A1* | 1/2003 | Cole | G01J 5/20 250/338.1 |
| 2003/0141453 A1* | 7/2003 | Reed | B82Y 30/00 250/338.1 |
| 2004/0113076 A1* | 6/2004 | Guo | G01H 11/08 250/338.1 |
| 2005/0082481 A1* | 4/2005 | Vilain | G01J 5/20 250/338.1 |
| 2006/0188400 A1* | 8/2006 | Sasaki | G01J 5/08 422/82.02 |
| 2007/0170359 A1* | 7/2007 | Syllaios | G01J 3/02 250/338.1 |
| 2007/0170360 A1* | 7/2007 | Gooch | G01J 5/20 250/338.1 |
| 2007/0170363 A1* | 7/2007 | Schimert | G01J 5/02 250/353 |
| 2007/0290282 A1* | 12/2007 | Belov | H01F 7/066 257/421 |
| 2008/0035846 A1* | 2/2008 | Talghader | G01J 3/26 250/338.1 |
| 2008/0067389 A1* | 3/2008 | Vilain | G01J 5/02 250/338.1 |
| 2010/0030506 A1 | 2/2010 | Cairnduff | |
| 2010/0031992 A1* | 2/2010 | Hsu | H01L 35/32 136/223 |
| 2010/0178722 A1* | 7/2010 | De Graff | H01L 27/14618 438/65 |
| 2011/0240860 A1* | 10/2011 | Talghader | G01J 5/02 250/338.4 |
| 2011/0266445 A1* | 11/2011 | Beratan | G01J 1/02 250/338.4 |
| 2011/0315880 A1* | 12/2011 | Nemirovsky | G01J 1/4228 250/340 |
| 2013/0248712 A1* | 9/2013 | Abdolvand | G01J 5/022 250/338.1 |
| 2014/0326883 A1* | 11/2014 | Abdolvand | G01J 5/022 250/338.1 |

FOREIGN PATENT DOCUMENTS

| | | |
|---|---|---|
| CN | 101978246 | 2/2011 |
| CN | 102405400 | 4/2012 |

OTHER PUBLICATIONS

Partial European Search Report of Feb. 12, 2014 for European Patent Application No. 13192784.0, 6 pages.

Hoo Kim et al., "Effects of square holes to reduce thermal mass in dopole patterned resistive sheets metamaterial microbolometer", MIOMC-XI Infrared Optoelectronics: Materials and Devices, Jan. 1, 2012.

Gaalema et al., Final Report for topic A10a-T004 STTR entitled "MEMS based thermopile infrared detector array for chemical and biological sensing," conducted by Black Forest Engineering for U.S. Army Research Office, dated Apr. 20, 2011, 27 pages.

Hayat, Majeed M., et al., "Statistical Algorithm for Nonuniformity Correction in Focal-Plane Arrays," Applied Optics, vol. 38, No. 8, Mar. 10, 1999, p. 772-780.

Hsu et al., "A new approach of thermal type microsensor with photonic crystal," Instrumentation on Measurement Technology Conference (I2MTC), IEEE, 4 pages, Department of Mechatronics Engineering, National Changhua University of Education.

Electrophysics Resource Center: Scientific Imaging. White Paper: Understanding Infrared Camera Thermal Image Quality. Edition: Nov. 2009 rev03, 2009, 12 pages. Available at: www.electrophysics.com/e/d1-files/whitepapers_ph/WP-Ph-TIQ.pdf (Accessed, Dec. 7, 2012).

U.S. Appl. No. 13/434,075, filed Mar. 29, 2012, 28 pages.

U.S. Appl. No. 13/426,165, filed Mar. 21, 2012, 28 pages.

Forg, B., et al., "Thermopile Sensor Array with Improved Spatial Resolution, Sensitivity and Image Quality," Sensor + Test Conferences 2011—IRS$^2$ Proceedings, pp. 42-44.

Extended European Search Report of Apr. 10, 2014 for European Patent Application No. 13192784.0 filed Nov. 13, 2013. 12 pages.

Office Action of Apr. 23, 2015 for counterpart Chinese Patent Application No. 201310624774.7, 6 pages.

Chinese Office Action of Nov. 6, 2015 for Chinese Application No. 201310624774.7, filed Nov. 28, 2013. 8 pages.

\* cited by examiner

Array of square holes

50% Hole Fill Factor
5μm Thick Table

Array of square pillars

64% Lane Fill Factor
5μm Thick Table

PHOTONIC SENSOR AND A METHOD OF MANUFACTURING SUCH A SENSOR

FIELD

The present invention relates to a photonic sensor, such as an infra-red sensor, and to a method of manufacture of such as sensor.

BACKGROUND

Thermocouple based sensors are known where a thermocouple junction is formed in close proximity to an infrared receiving area. The heating energy delivered per unit area by infrared (IR) radiation arriving at the thermocouple and/or at an IR collector associated with the thermocouple can be quite small, and it is desirable to make best use of it.

SUMMARY

According to a first aspect of the present invention there is provided a photonic sensor, comprising:
a platform supported by at least one slender element,
a temperature sensor on the platform, and
a structure formed on or as part of the platform.

It is thus possible to provide a sensor, such as an infrared sensor, where suitable profiling of the platform can reduce the mass, and hence the heat capacity of the platform. The profiling may be done by micro-machining of the platform. This micromachining can be performed during the formation of the platform and enables the formation of an improved platform at substantially no additional cost compared to forming a platform having a planar surface.

Heat transfer between a platform that is acting as an infrared radiation capturing element and a supporting substrate can be reduced by the use of slender supports that may suspend the platform over the substrate.

According to a further aspect of the invention, there is provided a method of forming a photonic sensor, comprising processing a portion of a semiconductor substrate so as to form a platform held to a supporting structure by at least one leg, and further comprising forming a sub-wavelength structure on an upper surface of the platform, said structure comprising either a plurality of isolated or interconnected upstanding regions.

The temperature sensor may be a thermocouple, a thermopile, a bolometer or any other suitable sensing technology.

BRIEF DESCRIPTION OF THE DRAWINGS

Embodiments of the invention will be described, by way of non-limiting example only, with reference to the accompanying drawings, in which.

DETAILED DESCRIPTION

Figure 1:
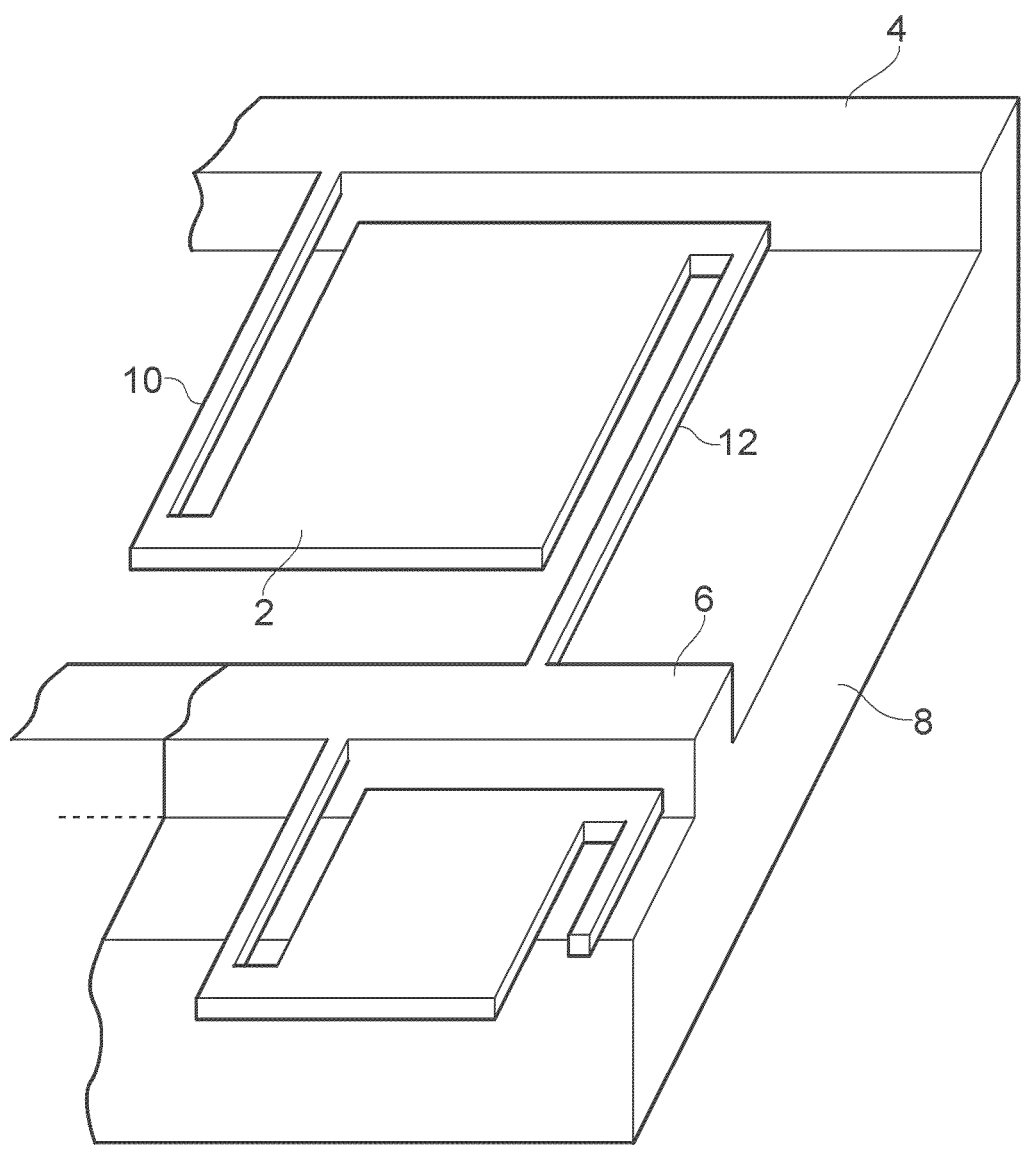
FIG. 1 is a perspective view of a first embodiment of an infrared sensor.

A first embodiment is schematically illustrated, in perspective view, in FIG. 1. A platform 2, which is formed by masking and etching steps commonly available in semiconductor fabrication processes, is held attached to a supporting structure, such as walls 4 and 6 standing proud of a substrate 8. The platform 2 is held attached to the walls 4 and 6 by slender supporting legs 10 and 12 which provide an elongate and thin connection between the platform 2 and the walls 4 and 6, and thereby hold it over the substrate 8. This thin and elongate path provides a high thermal impedance between the platform 2 and the substrate 8. This is beneficial as infrared (IR) radiation impinging on the platform 2 raises the temperature of the platform above that of the substrate in order for the intensity of the radiation to be measured by the sensor.

The legs in the embodiment shown in FIG. 1 are attached at opposing corners of the platform 2. This gives good structural reliability whilst forming an elongate thermal path. The platform may be connected in other ways. The connection(s) could be made midway along the sides of the table, and the connection, or each connection, could be made to a single wall. However, the slender connections are made such that the sum of the widths of each connection where they join the platform is less than one quarter of the perimeter of the platform. Where the platform is rectangular the sum of the width of the interface regions where the legs meet the edge of the platform 2 is less than the length of the shortest side of the rectangular platform. Preferably the sum of the width of the legs is much less than the length of the shortest side, say less than 10%.

The platform need not be square or rectangular, and other shapes such as triangular, polygonal (such as hexagonal or octagonal) or circular platform shapes may be used. The legs 10 may be arranged to be meandering and may have several folds in them, and/or may wrap or circle around part of the platform, but in a plane parallel with the surface of the platform 2.

The slender or elongate legs present a length which is several, for example >3, times their width, thereby providing good isolation from heat conduction between the platform 2 and the walls 4 and 6 and the substrate.

Convection is minimized by placing the substrate, or at least the part of it that carries the platform 2, or each platform 2, within an evacuated region. Such an evacuated region may be formed by placing the entirety of the substrate in an evacuated case having an infrared window to admit light onto the platform 2, and/or a cover may be bonded directly to the substrate, using suitable spacing components.

In a second embodiment based on the first embodiment, the platform 2 is further processed to give it a non-uniform surface. This may be achieved by selectively etching away parts of the platform. In the embodiment shown in FIG. 2 the platform 2 is etched to form an array of apertures 20 that pass through the platform 2. This gives the platform 2 a grid like structure.

The removal of material from the platform reduces the mass of the platform and hence the heat capacity of the platform 2. However the applicant has found that provided the width of an aperture is comparable to or less than the wavelength of the impinging optical radiation to be detected, the incoming optical radiation does not pass through the hole and the energy it was carrying is given up to heat the platform. The aperture thus forms a sub-wavelength structure on the platform 2. Thus the mass of the platform is significantly reduced, whilst the ability of the platform to absorb photons of infrared radiation is substantially unaffected. Thus the platform can warm more quickly in response to an increase in impinging radiation flux to reach a new equilibrium temperature more quickly than a platform that has not been processed to reduce its mass.

Figure 3:
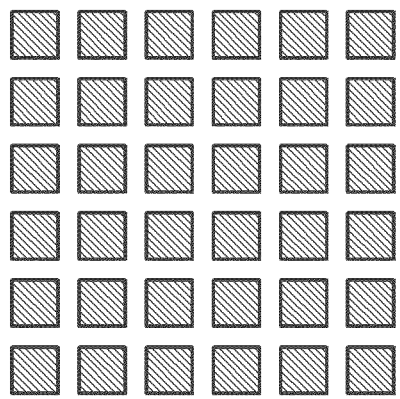
FIG. 3 is a plan view of an embodiment having an array of holes formed in an infrared detection platform.

FIG. 3 illustrates, in plan view, an embodiment where an array of square holes was formed in a platform 2 having dimensions of roughly 100 micrometers by 100 micrometers and a thickness of around 5 micrometers. The holes were positioned and dimensioned such as to have a fill factor of substantially 50%. Thus, for example, the holes may have a side length of around 6.3 μm and the holes may be provided in an array having a periodicity of around 9 μm.

Figure 2:
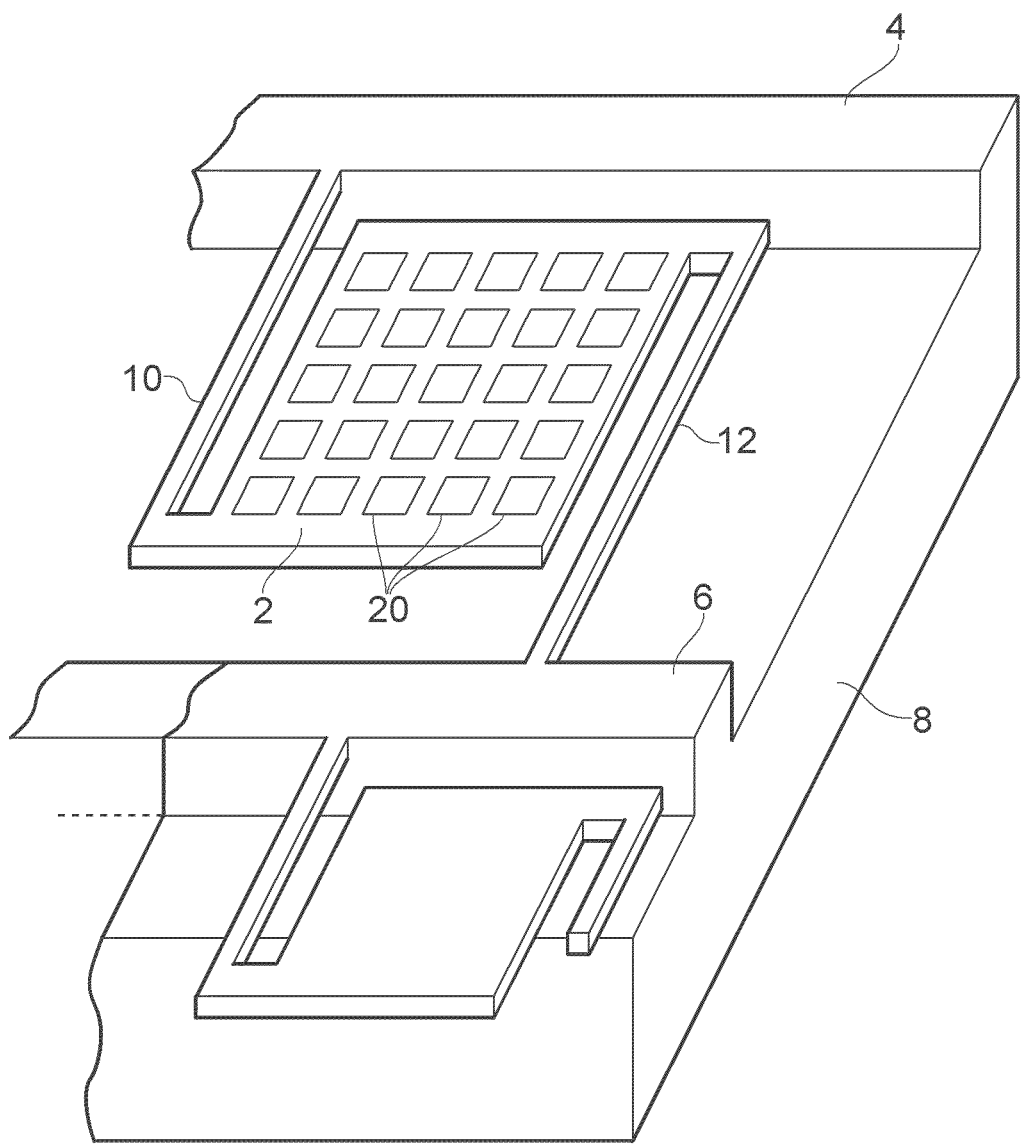
FIG. 2 is a perspective view of an embodiment having an array of holes in an infrared detector platform.

In FIGS. 2 and 3 the apertures or holes have been shown as being regularly shaped and regularly positioned. This is merely for diagrammatic convenience, and whilst platforms may be formed with regularly arranged apertures, this is not a limitation. Indeed the spacing between apertures and/or their sizes may be deliberately varied so as to tailor the response of the platform to incoming radiation.

Figure 4:
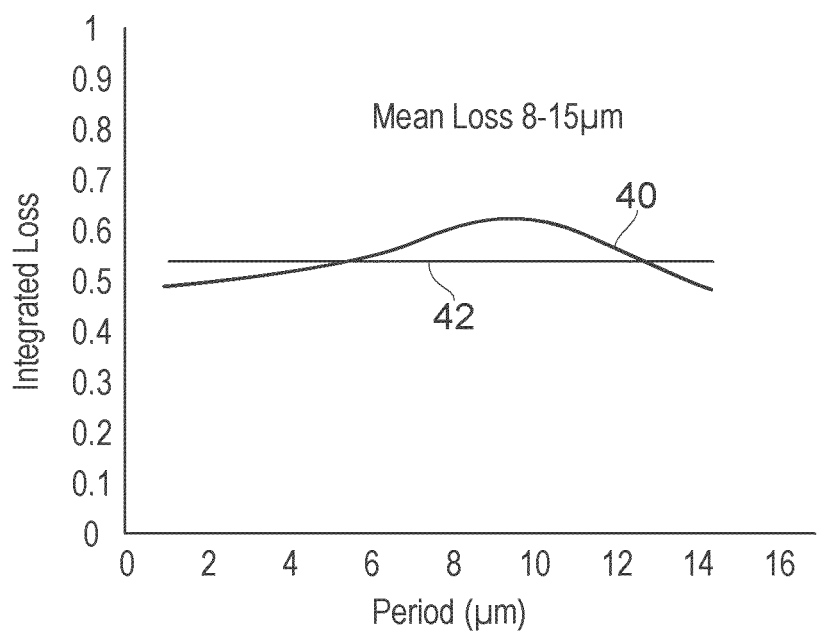
FIG. 4 is a graph comparing integrated loss for a platform as shown in FIG. 3 and a platform, as shown in FIG. 1, having no holes therein.

FIG. 4 compares simulated results for an IR sensor constituting an embodiment of the invention and having an array of holes formed therein with a similar sensor, but not having the holes formed therein, as shown in FIG. 1. The energy lost from the photons and given to the perforated platform is designated by line 40 for incoming IR having a wavelength of 8 to 15 μm, whereas the response for a platform that does not have apertures formed therein is shown by line 42. It can be seen that the results are very similar with the energy loss (i.e. how much of the theoretically impinging energy that actually could be converted into heat is converted to heat) being better at some wavelengths for a platform 2 having no apertures therein, whereas at other wavelengths the apertures in the platform degrade its performance compared to a platform with a planar surface.

In another embodiment, the surface of the platform may be etched to from a plurality of pillars or hills standing on the upper surface of the platform. The pillars may be provided by masking patches of the platform with a resist, and then exposing the remainder of the platform during an etch. If, for example, the pillars are formed in a regular array, such as a rectangular array, then the platform may be etched to form a plurality of intersecting trenches, and the regions that are surrounded by the trenches form the pillars. It will be appreciated an etching process such as an isotropic etch may be used to form a "V" shaped trench in the material of the platform, such as silicon dioxide, and hence with appropriate positioning and width selection of the trenches, the pillars may formed as pyramid like shapes. Such an etching process may also be used to reduce the height of the pillars giving rise to further reduction in the mass of the platform. Such a surface structure also tends to cause any of the IR radiation that was reflected from the surface rather than absorbed by it to be reflected towards another pillar, thereby giving a second chance to absorb energy from the light. The performance of pillars has been modeled for an array of pillars having a square profile of nominally 6.0 μm in an array having a periodicity of around 10 μm.

Figure 5:
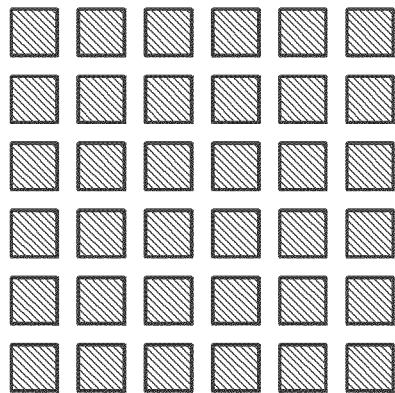
FIG. 5 is a plan view of an embodiment having an array of absorption elements extending upwardly from a base layer of an infrared detection platform.
Figure 6:
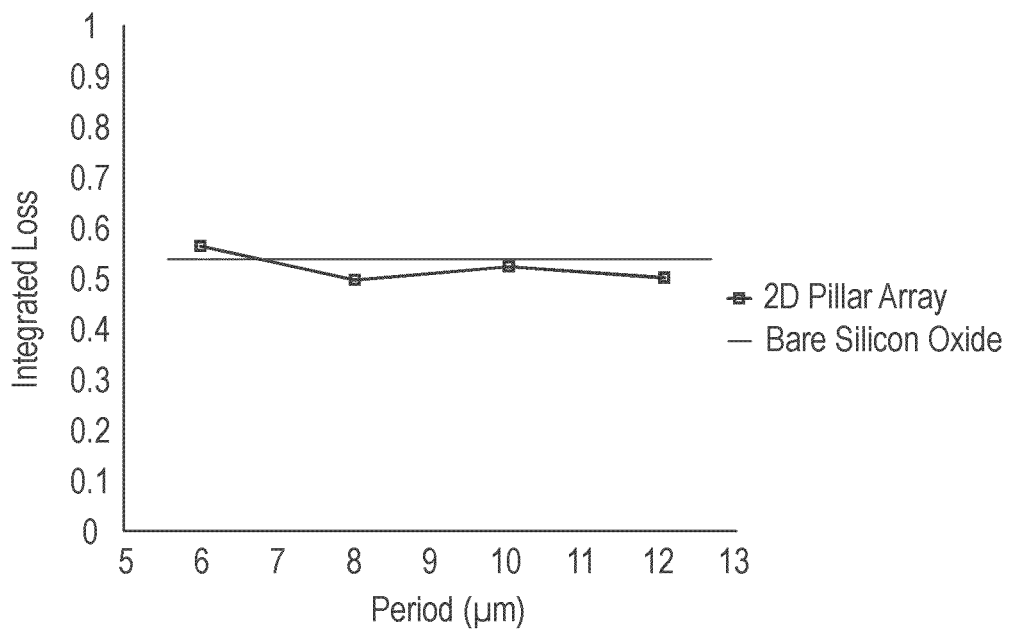
FIG. 6 is a graph comparing integrated loss for a platform as shown in FIG. 5 and a platform like that shown in FIG. 1 having a planar surface.

The array is illustrated, in plan view, in FIG. 5 and the integrated loss over a wavelength range of 8 to 15 μm with the pillars and surrounding trenches being modeled on a periodicity from 5 to 13 μm is shown in FIG. 6. It can be seen that the absorption performance is slightly degraded over the 8 to 15 μm band compared to un-profiled (planar) silicon dioxide, but the mass of the platform can be reduced by around 64%. Consequently a platform formed using this approach can significantly improve the response time to a change in infrared flux.

Figure 7:
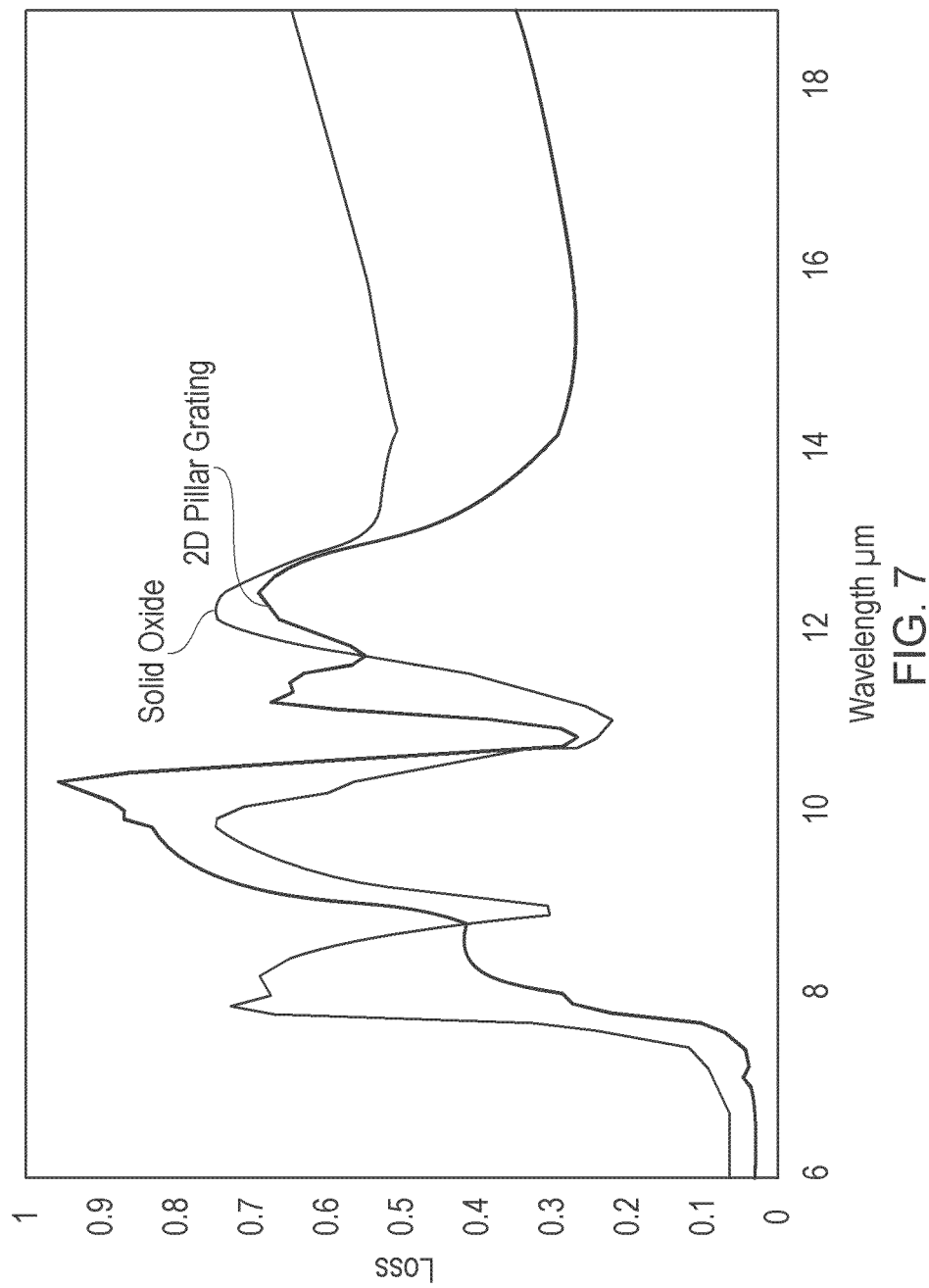
FIG. 7 is a graph showing loss as a function of wavelength of light impinging on a infrared detection platform of the type shown in FIG. 5.

FIG. 7 shows a simulation of loss as a function of IR wavelength for light in the range 6 to 18 μm impinging on a two dimensional array of pillars and on planar silicon dioxide. It can be seen that for some wavelengths, such as around 10 μm the pillar array out-performs the planar surface.

The simulations presented herein have used a single material, silicon dioxide, however it is expected that the use of multilayer stacks incorporating materials such as silicon nitride used as part of a standard CMOS process would not materially affect the result.

Embodiments having an array of holes can be self-supporting, whereas an array of pillars is not self-supporting unless steps are taken to limit the vertical extent of the etch. However, in a further embodiment a support layer is provided. The support layer may be provided as a metal layer, as this is a standard offering in an integrated circuit fabrication process. The use of a metal layer is advantageous because it acts as a further reflector, such that radiation reaching the metal layer is reflected back into the absorbing material of the platform.

The metal layer also presents a thermally conductive layer that aids the conduction of heat from the absorbing material (e.g., silicon oxide) forming the pillars to a temperature measuring element such as a thermocouple junction or junctions.

Advantageously the metal layer may be perforated. The perforations act to reduce the mass of the metal layer by a small amount without substantially affecting conductivity within the layer. They also have the advantage of allowing etchant to reach beneath the platform and improve the etching of the cavity between the bottom of the platform and the underlying substrate. This has a two-fold advantage. Firstly, it reduces the risk of incomplete release of the platform from the substrate—and hence the reduced heating of the platform when exposed to IR. Secondly, it also removes silicon dioxide or other material attached to the underside of the metal layer, thereby allowing further control of the thickness of the platform, and further thinning thereof.

Figure 8:
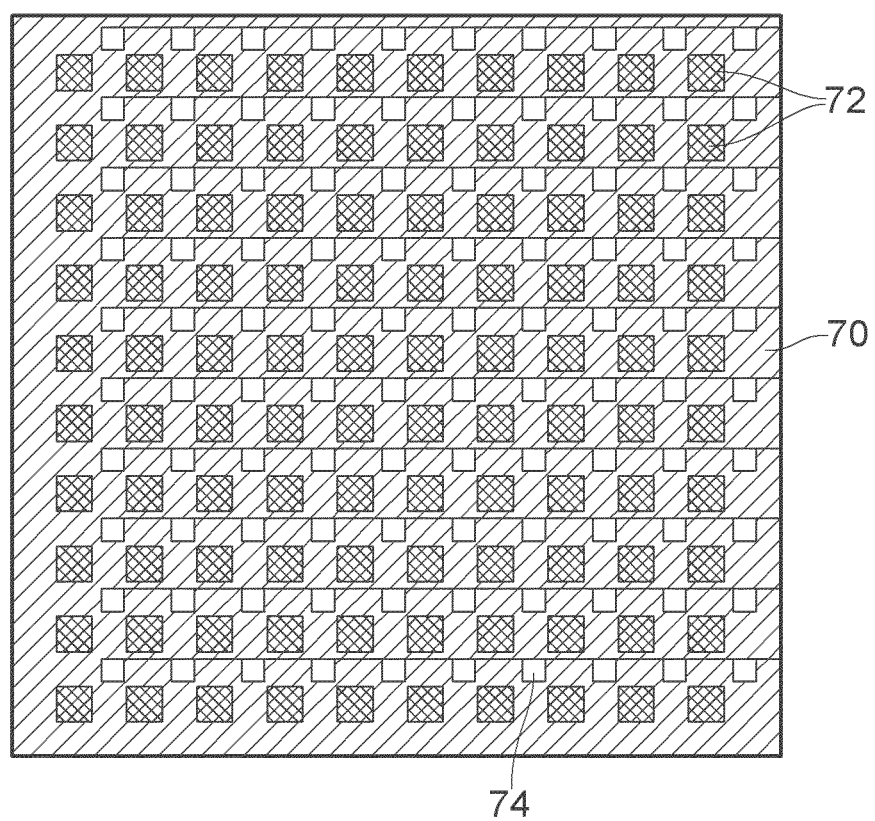
FIG. 8 is a plan view of a metal layer in an infrared detector constituting a further embodiment of the invention.

A plan view of a metal backed platform with an array of absorbing pillars formed thereon is illustrated in FIG. 8. The metal layer is shown as item 70, with the array of upstanding pillars 72 extending from the layer 70. A plurality of apertures 74 are also formed in the metal layer 70, and have in this instance been formed with the same periodicity as the pillars 72. This is convenient as it enables the definition of a repeatable unit cell that can be replicated time and time again, but in general there is no requirement for an aperture 74 in the metal layer to be associated with each individual pillar.

Figure 9:
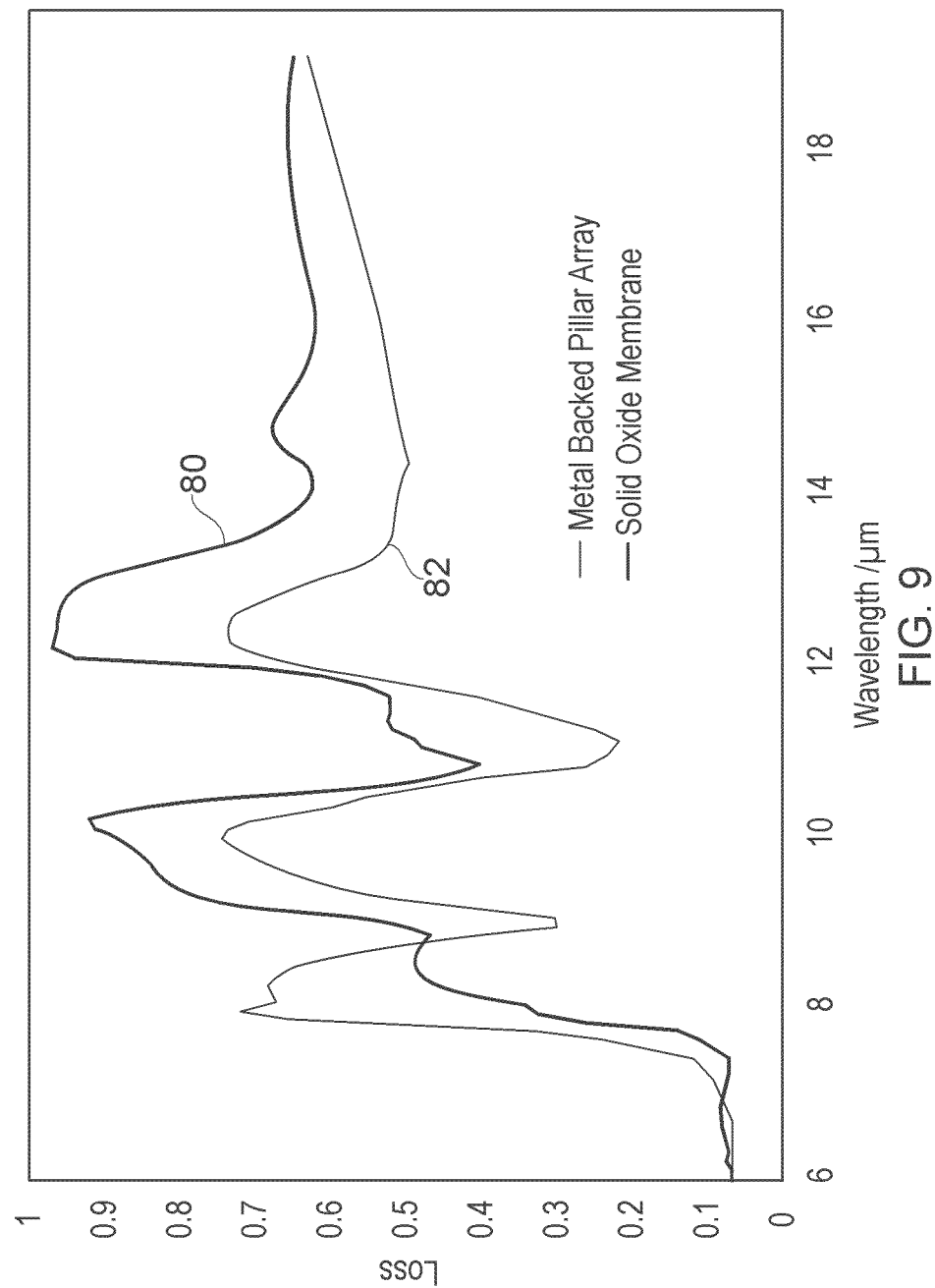
FIG. 9 is a graph comparing the performance of an embodiment having the metal layer of FIG. 7 in association with upstanding pillars with a platform of the type shown in FIG. 1.

Simulated results of the performance, in this case the energy that is lost from a photon to a metal backed platform 2 having material etched from a front surface so as to leave an array of pillars thereon, is compared to the performance of an equivalent IR detection platform fabricated only from a membrane of silicon dioxide, as a function of wavelength. The response characteristic of the pillar array is designated 80 in FIG. 9. The response of the solid (planar) oxide membrane is designated 82. The array of pillars collects more of the energy from the photon than the solid oxide platform 2, and the pixel formed by such a platform with the pillars formed thereon has a significantly reduced thermal mass, and hence exhibits an improved responsiveness, as manifested in a reduced time constant, to move from a first equilibrium temperature to a second equilibrium temperature in response to a change in the impinging radiation, for example as a result of a hotter body being within the field of view of the platform 2.

Figure 10A:
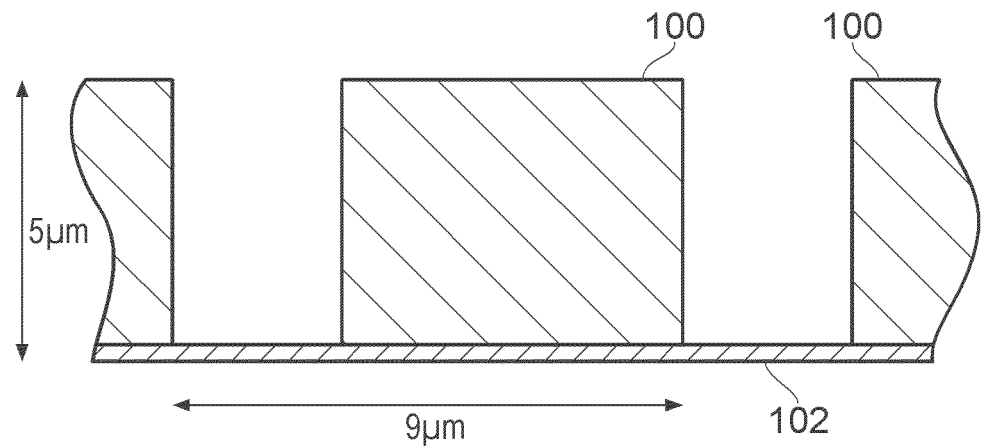
FIGS. 10*a* and 10*b* show profiles of pillars and other infrared collecting structures above a metal layer in an embodiment of an infrared photonic detector.
Figure 10B:
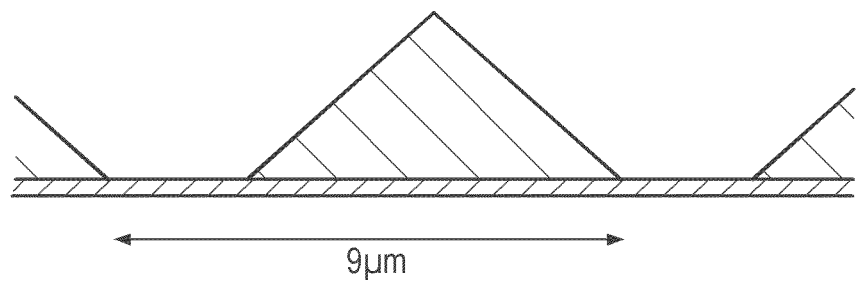

The formation of a metal layer within the platform may also be advantageous in the embodiment of FIG. 2 as it enables the ratio of the area of the apertures 20 to the area of the platform to be increased, while serving to ensure structural rigidity of the platform 2 and providing a thermal transfer layer to conduct heat towards the thermocouple junction. The additional structural integrity that the metal layer provides may be exploited to enable further mass reduction of the platform, for example by profiling the pillars such that they are tapered, as shown in FIGS. 10a and 10b. FIG. 10a is a cross section through a platform like that shown in FIG. 5. Here the pillars are formed by etching holes through the silicon dioxide, and other materials such as silicon nitride, used to form the platform during formation of the sensor in a CMOS process. Here, the pillars 100 are shown as having a nominal width of 6 μm and a periodicity of 9 μm above metal layer 102. However, other widths and periodicities can be used.

If the array is etched with an isotropic etchant then the etchant may undercut the resist, possibly to the extent that the resist becomes fully under-etched and detached from the wafer. Alternatively after forming the pillars of FIG. 10a, the surrounding surface of the wafer may be masked, and then the unprotected structure of FIG. 10a subjected to isotropic etching to reduce the height of the pillars 100 and produce pyramidal shaped features as shown in FIG. 10b.

Although the "pillars" have been described as being formed in a regular array, embodiments are not limited to use of such a regular geometry and the pillar size, inter-pillar spacing and shape may be varied in order to modify the response profile of the sensor. Thus the voids between pillars need also not be uniform, and may be of non-uniform size or depth.

Furthermore, where multiple sensors are formed, one or more of them may differ from others of the sensors formed in the same integrated circuit or die so as to tailor the response of the ensemble of sensors.

Figure 11:
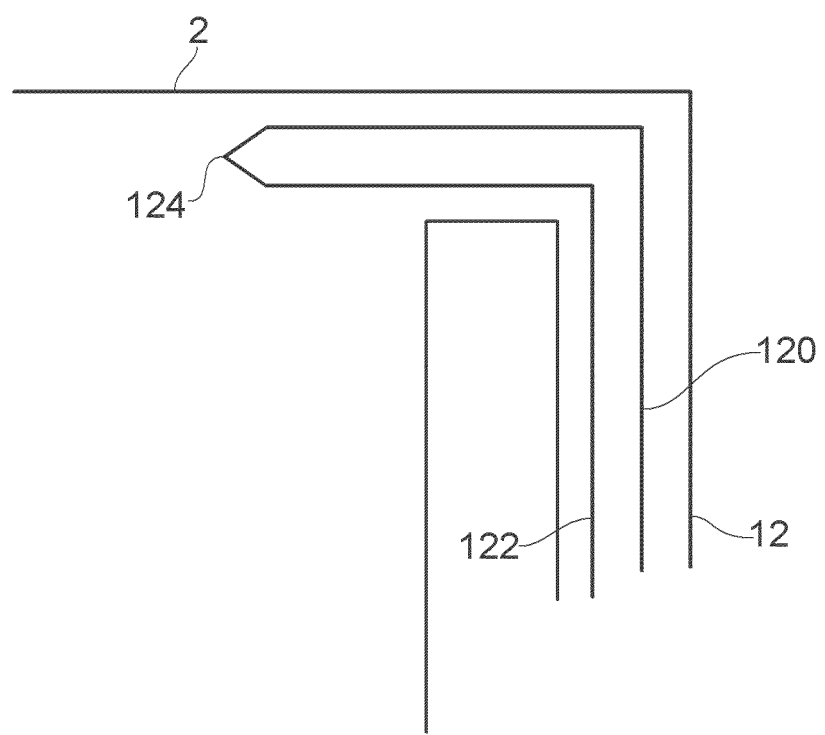
FIG. 11 shows the positioning of a thermocouple at one corner of the platform.

FIG. 11 shows a corner of the platform 2 of FIG. 1, 2, 3 or 5 and a single leg 12. The leg has two tracks of polysilicon, having different doping types or concentrations, identified as items 120 and 122, respectively. The tracks form dissimilar conductors that meet at a junction 124 forming the "hot" junction of a thermocouple. "Cold" junctions can be formed at the interface between the polysilicon tracks 120 and 122 and metal conductors on the substrate 2 or in or on the walls 4 and 6 (see FIG. 1 or 2). A thermocouple may be formed adjacent a further leg, and the thermocouples can be connected in series to form a thermopile. Other suitable materials such as silicon-germanium (SiGe), $Bi_2Te_3$, $Sb_2Te_3$, etc may be used in place of the polysilicon. For example, the hot junction may be formed at the interface of two differently doped SiGe conductors.

A plurality of such platforms 2 with associated thermocouples may be placed in an array to form an imaging device. Array sizes of just a few pixels to thousands of pixels are possible.

The platform described herein is not limited to use with any particular sensing technology. Thus, instead of forming thermocouples on the platform, sensors such as bolometers may be formed. The operation of a bolometer is known to the person skilled in the art. One or more temperature dependent resistors can be formed on or in the platform, from suitable known materials, and the change in resistance can be detected, for example by connecting a temperature dependent resistor into a Wheatstone bridge circuit.

Although the examples described have been restricted to the infrared range up to 15 micrometers, detection of longer wavelengths up to around 50 micrometers is possible with suitably configured structures. Accordingly, a plurality of features (e.g., column or hill like structures) is formed in an intra-structure scale of less than lambda, where lambda is the maximum wavelength to be detected. Lambda can be about $50 \times 10^{-6}$ m for very long wave (THz) infrared, and about $15 \times 10^{-6}$ m for near infrared.

The formation of embodiments of the invention will be evident to the person skilled in the art. However, just for the sake of completeness, a brief overview is given here. The standard CMOS process may be employed up to passivation, during which the thermocouples or thermopiles are formed, and any metal layers associated with the platform, or each platform, are appropriately patterned. The standard CMOS process allows for a plurality of metal layers (often 6) to be formed over the substrate with silicon oxide as insulator therebetween. In the table none or only one of the layers need be provided. The passivation is then selectively opened and the underlying silicon is etched to define the limit of the table, or each table, and its legs. The table may be structured with the sub-wavelength features (holes and/or pillars) discussed herein. Thus these features are effectively free, as the processing steps used to form them were going to be performed anyway. Finally an isotropic etch (e.g., using $XeF_2$) is used to remove silicon from under the table, thereby releasing it. Other fabrication options include micromachining the semiconductor wafer.

The completed wafer may then be packaged in an evacuated package, which may include features for forming an aperture to control a field of view.

The platform 2 may also include a conductive track on or adjacent the platform such that the platform can be subjected to ohmic heating for test or calibration purposes.

It is thus possible to provide an improved photo detector.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A photonic sensor, comprising:
a platform supported over a substrate by at least one leg, wherein there is a gap between the platform and the substrate;
a structure of the platform comprising dielectric material having a structure with reduced mass relative to a corresponding planar layer of dielectric material, the dielectric material comprising at least one of silicon oxide or silicon nitride;
a metal layer of the platform configured to reflect radiation back to the dielectric material, wherein the gap is between the metal layer and the substrate, and wherein the metal layer is perforated; and
a temperature sensor on the platform, wherein the temperature sensor is configured to sense a change in temperature due to absorption of radiation by the dielectric material of the platform.

2. A sensor as claimed in claim 1, in which the structure is etched into the platform.

3. A sensor as claimed in claim 1, in which the structure comprises a plurality of voids.

4. A sensor as claimed in claim 3, in which the voids form a plurality of intersecting trenches.

5. A sensor as claimed in claim 3, in which the voids are not of uniform depth within the platform.

6. A sensor as claimed in claim 1, in which the platform further comprises a semiconductor layer in association with the metal layer.

7. A sensor as claimed in claim 1, wherein the dielectric material of the platform comprises a layer of silicon nitride.

8. A sensor as claimed in claim 1, wherein the dielectric material of the platform comprises a plurality of column or hill like structures extending from a first side of the metal layer.

9. A sensor as claimed in claim 8, in which the plurality of column or hill like structures are formed in an intra-structure scale of less than lambda, where lambda is the maximum wavelength to be detected, and is $50 \times 10^{-6}$ m or less.

10. A sensor as claimed in claim 1, comprising a plurality of platforms arranged in an array within an evacuated cavity bounded on a first side by a window.

11. A sensor as claimed in claim 1, in which the platform is supported by two or more slender legs, each of the slender legs having a length that is at least three times a corresponding width, said slender legs having a combined width at an interface with the platform of less than one quarter of the periphery of the platform.

12. A sensor as claimed in claim 1, in which the temperature sensor is a thermocouple junction.

13. A temperature sensor as claimed in claim 12, in which the thermocouple junction comprises one of:
a) a polysilicon to polysilicon junction, where a doping concentration varies across the junction; or
b) a SiGe to SiGe junction.

14. A sensor as claimed in claim 1, further comprising a conductor on or adjacent the platform configured to provide ohmic heating to the platform.

15. A sensor as claimed in claim 1, in which the temperature sensor is a temperature dependent resistor.

16. A sensor as claimed in claim 1, wherein the dielectric material comprises the silicon oxide.

17. A sensor as claimed in claim 1, wherein the leg comprises a slender element having a length and a width, the length being at least three times the width.

18. A sensor as claimed in claim 1, wherein the at least one leg is configured to support the platform above a substrate in a substantially fixed position.

19. A sensor as claimed in claim 1, wherein the structures comprises at least one of columns of the dielectric material or dielectric material having holes therethrough.

20. A method of forming a photonic sensor, comprising:
processing a portion of a semiconductor substrate so as to form a platform supported over a substrate and held to a supporting structure by at least one leg, the platform comprising dielectric material and a metal layer, the dielectric material comprising at least one of silicon oxide or silicon nitride, the metal layer forming a lower surface of the platform, the metal layer being configured to reflect radiation back to the dielectric material, wherein the metal layer is perforated, and wherein there is a gap between the lower surface of the platform and the substrate;
forming a sub-wavelength structure on an upper surface of the platform, said structure comprising either a plurality of isolated or interconnected upstanding regions of the dielectric material; and
forming a temperature sensor on the platform, wherein the temperature sensor is configured to sense a change in temperature due to absorption of radiation by the dielectric material.

21. A method as claimed in claim 20, in which the processing comprises masking and etching the substrate to form the platform.

22. A method as claimed in claim 21, in which the platform is released from contact with the substrate to form the gap by etching material between the platform and the substrate, wherein the perforations in the metal layer allow etchant to flow through the platform.

23. A method as claimed in claim 20, in which the at least one leg has a length and a width, the length being at least three times the width.

24. A photonic sensor, comprising:
a platform supported by at least one leg;
a structure of the platform comprising dielectric material and a plurality of voids, the dielectric material comprising at least one of silicon oxide or silicon nitride;
a metal layer of the platform configured to reflect radiation back to the dielectric material, wherein the metal layer is perforated; and
a temperature sensor on the platform, wherein the temperature sensor is configured to sense a change in temperature due to absorption of radiation by the dielectric material of the platform;
wherein the sensor is configured to detect impinging optical radiation, and wherein the voids each have a width approximately equal to a wavelength of the impinging optical radiation.

25. A sensor as claimed in claim 24, wherein the optical radiation has a wavelength in the range from about 8 μm to 15 μm.

* * * * *